(12) United States Patent
Dunton et al.

(10) Patent No.: US 8,987,119 B2
(45) Date of Patent: Mar. 24, 2015

(54) PILLAR DEVICES AND METHODS OF MAKING THEREOF

(75) Inventors: Vance Dunton, San Jose, CA (US); S. Brad Herner, San Jose, CA (US); Paul Wai Kie Poon, Fremont, CA (US); Chuanbin Pan, San Jose, CA (US); Michael Chan, Mountain View, CA (US); Michael Konevecki, San Jose, CA (US); Usha Raghuram, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 1026 days.

(21) Appl. No.: 13/026,381

(22) Filed: Feb. 14, 2011

(65) Prior Publication Data

US 2011/0136326 A1    Jun. 9, 2011

Related U.S. Application Data

(63) Continuation of application No. 12/007,781, filed on Jan. 15, 2008, now Pat. No. 7,906,392.

(51) Int. Cl.
*H01L 21/36* (2006.01)
*H01L 27/102* (2006.01)
(Continued)

(52) U.S. Cl.
CPC ........ *H01L 27/1021* (2013.01); *H01L 29/8613* (2013.01); *H01L 29/8615* (2013.01); *H01L 29/868* (2013.01)
USPC ........... 438/479; 438/424; 438/101; 438/257; 438/238; 438/239; 438/386; 438/399; 438/584; 438/669; 438/675

(58) Field of Classification Search
CPC ... H01L 29/1606; H01L 21/36; H01L 21/326; H01L 29/00
USPC ......... 438/479, 141, 424, 257, 238, 239, 386, 438/399, 467, 100, 101, 478, 584, 597, 669, 438/672, 674, 675
See application file for complete search history.

(56) References Cited

U.S. PATENT DOCUMENTS

| 5,780,908 A | 7/1998 | Sekiguchi et al. |
| 5,891,778 A * | 4/1999 | Wen .............................. 438/276 |

(Continued)

FOREIGN PATENT DOCUMENTS

| JP | 4-67671 | 3/1992 |
| JP | 6-334139 | 12/1994 |

(Continued)

OTHER PUBLICATIONS

International Preliminary Report on Patentability, International Application PCT/US2009/030937. International Bureau of WIPO, Jul. 29, 2010.

(Continued)

*Primary Examiner* — Chuong A Luu
(74) *Attorney, Agent, or Firm* — The Marbury Law Group PLLC

(57) ABSTRACT

A method of making a semiconductor device includes providing an insulating layer containing a plurality of openings, forming a first semiconductor layer in the plurality of openings in the insulating layer and over the insulating layer, and removing a first portion of the first semiconductor layer, such that first conductivity type second portions of the first semiconductor layer remain in lower portions of the plurality of openings in the insulating layer, and upper portions of the plurality of openings in the insulating layer remain unfilled. The method also includes forming a second semiconductor layer in the upper portions of the plurality of openings in the insulating layer and over the insulating layer, and removing a first portion of the second semiconductor layer located over the insulating layer. The second conductivity type second portions of the second semiconductor layer remain in upper portions of the plurality of openings in the insulating layer to form a plurality of pillar shaped diodes in the plurality of openings.

35 Claims, 8 Drawing Sheets

(51) Int. Cl.
*H01L 29/861* (2006.01)
*H01L 29/868* (2006.01)

(56) References Cited

U.S. PATENT DOCUMENTS

| | | | |
|---|---|---|---|
| 5,915,167 | A | 6/1999 | Leedy |
| 5,937,280 | A | 8/1999 | Wen |
| 6,034,882 | A | 3/2000 | Johnson et al. |
| 6,083,787 | A | 7/2000 | Lee |
| 6,133,149 | A | 10/2000 | Yeh |
| 6,420,215 | B1 | 7/2002 | Knall et al. |
| 6,429,449 | B1 | 8/2002 | Gonzalez et al. |
| 6,525,953 | B1 | 2/2003 | Johnson |
| 6,750,091 | B1 | 6/2004 | Gonalez et al. |
| 6,952,043 | B2 | 10/2005 | Vyvoda et al. |
| 7,151,046 | B2 | 12/2006 | Takeda et al. |
| 7,238,607 | B2 | 7/2007 | Dunton |
| 7,285,464 | B2 | 10/2007 | Herner et al. |
| 7,737,442 | B2 | 6/2010 | Yamazaki et al. |
| 2002/0163027 | A1 | 11/2002 | Skotnicki et al. |
| 2004/0137721 | A1 | 7/2004 | Lim et al. |
| 2004/0157354 | A1 | 8/2004 | Kuriyama et al. |
| 2005/0052915 | A1 | 3/2005 | Herner et al. |
| 2005/0062079 | A1 | 3/2005 | Wu et al. |
| 2006/0189077 | A1 | 8/2006 | Herner et al. |
| 2006/0237756 | A1* | 10/2006 | Park et al. ............ 257/296 |
| 2006/0249753 | A1 | 11/2006 | Herner et al. |
| 2006/0284237 | A1 | 12/2006 | Park et al. |
| 2007/0086235 | A1 | 4/2007 | Kim et al. |
| 2007/0090425 | A1 | 4/2007 | Kumar et al. |
| 2007/0164309 | A1 | 7/2007 | Kumar et al. |
| 2007/0284656 | A1 | 12/2007 | Radigan et al. |
| 2008/0073755 | A1* | 3/2008 | Ang et al. ............ 257/656 |
| 2008/0078984 | A1 | 4/2008 | Park et al. |
| 2008/0128853 | A1 | 6/2008 | Choi et al. |
| 2008/0315174 | A1* | 12/2008 | Kang et al. ............ 257/4 |

FOREIGN PATENT DOCUMENTS

| | | |
|---|---|---|
| KR | 100768504 B1 | 10/2007 |
| WO | WO 2007/067448 A1 | 6/2007 |

OTHER PUBLICATIONS

A. E. Braun, Architecture Becomes Mainstream, Semiconductor International, vol. 28, No. 4, Feb. 2005, pp. 43-48.
J. Tony Pan et al., "Copper CMP and Process Control", CMP-MIC 99 Conference (Feb. 11-12, 1999), 7 pgs.
Shuji Ikeda et al., "Process Integration of Single-Wafer Technology in a 300-mm Fab, Realizing Drastic Cycle Time Reduction With High Yield and Excellent Reliability", IEEE Transactions on Semiconductor Manufacturing, vol. 16, No. 2, May 2003, pp. 102-110.
Jeff Gambino et al., "Thermal Oxidation of Ni and Co Alloys Formed by Electroless Plating", Materials Research Society, Symposium Proceedings vol. 914, Apr. 18-21, 2006, Abstract No. 0914-F05-09, pp. 173-179.
U.S. Appl. No. 11/819,078, filed Jun. 25, 2007, Herner.
Office Action mailed Dec. 9, 2009 in related U.S. Appl. No. 12/007,780.
International Search Report and Written Opinion, mailed Jun. 5, 2009, received in International Application No. PCT/US2009/030937.
Invitation to Pay Additional Fees, including partial International Search Report mailed Apr. 15, 2009, received in corresponding International application No. PCT/US2009/030937 (6 pgs.).
Office action mailed May 27, 2009, received in corresponding U.S. Appl. No. 12/007,780 (8 pgs.).
http://www.clarycon.com/Resources/Slide3t.jpg (1 pg.).
http://www.clarycon.com/Resources/Slide5i.jpg (1 pg.).

* cited by examiner

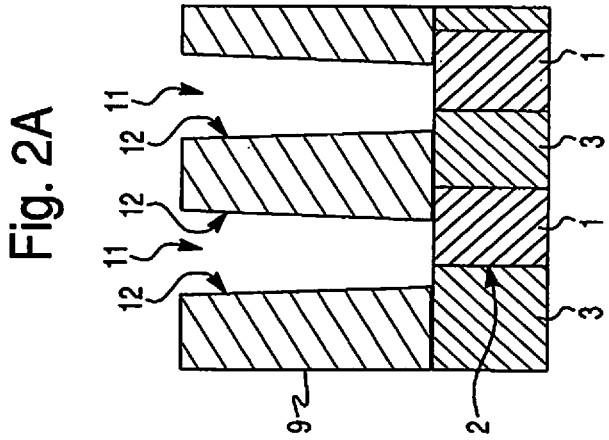
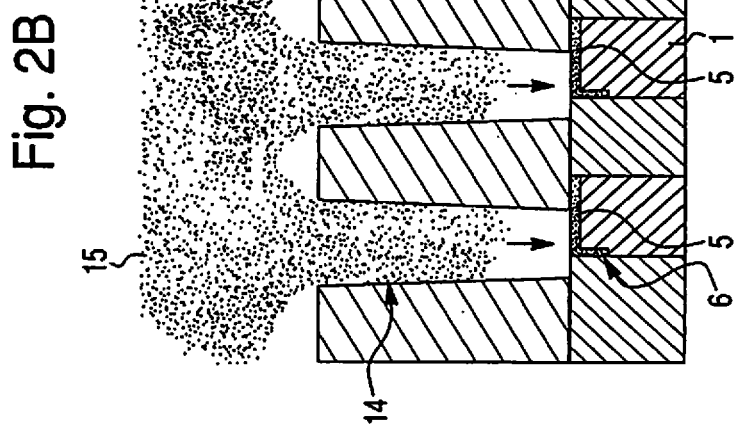
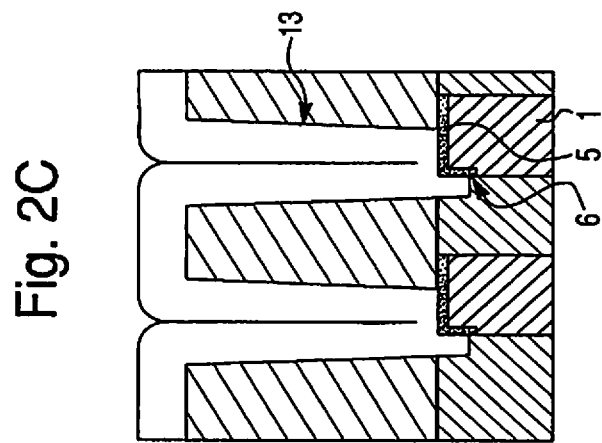

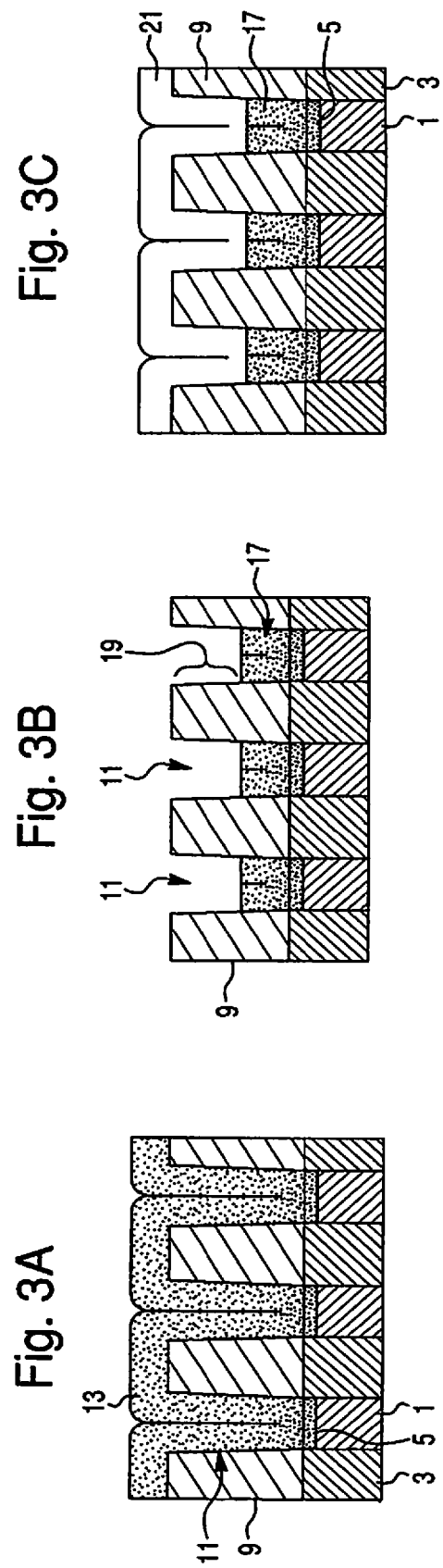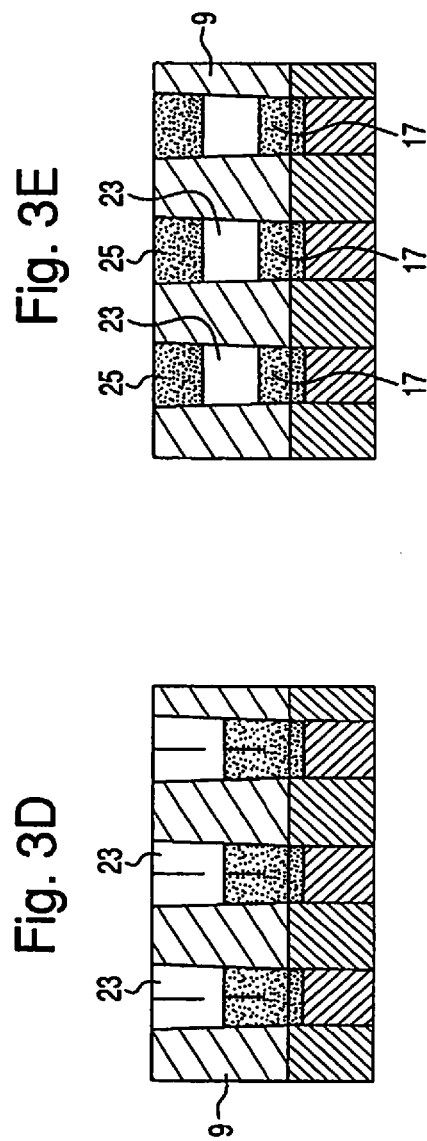

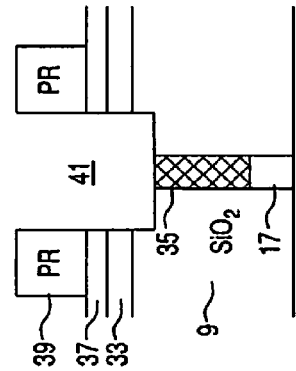
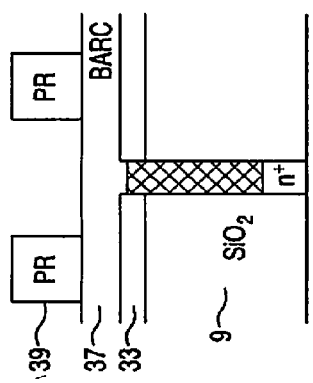
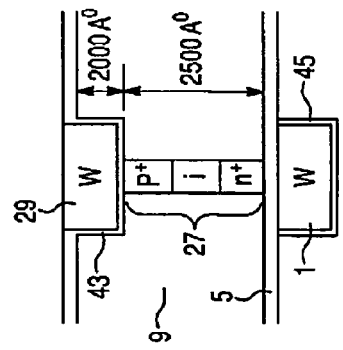
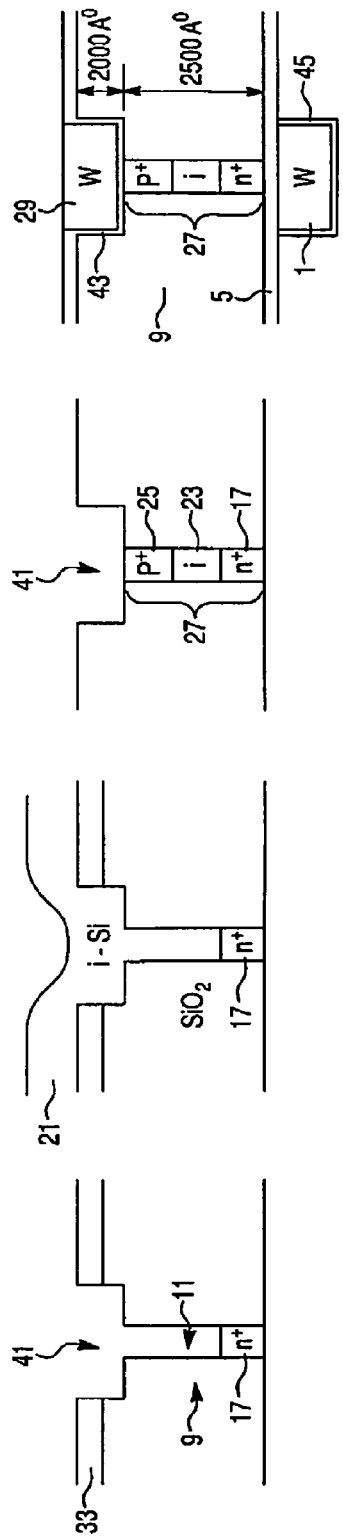

PILLAR DEVICES AND METHODS OF MAKING THEREOF

The present invention relates generally to the field of semiconductor device processing, and specifically to pillar devices and a method of making such devices. This application is a CON of Ser. No. 12/007,781 filed on Jan. 15, 2008. Now U.S. Pat. No. 7,906,392

BACKGROUND

Herner et al., U.S. patent application Ser. No. 10/955,549 filed Sep. 29, 2004 (which corresponds to US Published Application 2005/0052915 A1), hereby incorporated by reference, describes a three dimensional memory array in which the data state of a memory cell is stored in the resistivity state of the polycrystalline semiconductor material of a pillar shaped semiconductor junction diode. A subtractive method is used to fabricate such pillar diode devices. This method includes depositing one or more silicon, germanium or other semiconductor material layers. The deposited semiconductor layer or layers are then etched to obtain semiconductor pillars. A $SiO_2$ layer can be used as a hard mask for the pillar etching and removed afterwards. Next, $SiO_2$ or other gap fill dielectric material is deposited in between and on top of the pillars. A chemical mechanical polishing (CMP) or etchback step is then conducted to planarize the gap fill dielectric with the upper surface of the pillars.

For additional description of the subtractive pillar fabrication process, see Herner et al., U.S. patent application Ser. No. 11/015,824, "Nonvolatile Memory Cell Comprising a Reduced Height Vertical Diode," filed Dec. 17, 2004 and U.S. patent application Ser. No. 11/819,078 filed Jul. 25, 2007.

However, in the subtractive method, for small diameter or width pillar type devices, care must be taken to avoid undercutting the pillar at its base during the etching step. Undercut pillar devices may be susceptible to falling over during subsequent processing. Furthermore, for smaller pillar devices, the height of the semiconductor pillar may be limited by thin and soft photoresist used as the etching mask, the oxide gap filling step presents a processing challenge when the aspect ratio of the openings between the pillars increases, and the CMP process or etchback of the gap fill layer may remove a significant thickness of the deposited semiconductor material.

SUMMARY

One embodiment of this invention provides a method of making a semiconductor device, which includes providing an insulating layer containing a plurality of openings and forming a first semiconductor layer in the plurality of openings in the insulating layer and over the insulating layer. The method also includes removing a first portion of the first semiconductor layer, such that first conductivity type second portions of the first semiconductor layer remain in lower portions of the plurality of openings in the insulating layer, and upper portions of the plurality of openings in the insulating layer remain unfilled. The method also includes forming a second semiconductor layer in the upper portions of the plurality of openings in the insulating layer and over the insulating layer, and removing a first portion of the second semiconductor layer located over the insulating layer. The second conductivity type second portions of the second semiconductor layer remain in upper portions of the plurality of openings in the insulating layer to form a plurality of pillar shaped diodes in the plurality of openings.

Another embodiment provides a method of making a semiconductor device, comprising forming a plurality of tungsten electrodes, nitriding the tungsten electrodes to form tungsten nitride barriers on the plurality of tungsten electrodes, forming an insulating layer comprising a plurality of openings such that the tungsten nitride barriers are exposed in the plurality of openings in the insulating layer, and forming a plurality of semiconductor devices on the tungsten nitride barriers in the plurality of openings in the insulating layer.

Another embodiment provides a method of making a semiconductor device, comprising forming a plurality of tungsten electrodes, selectively forming a plurality of conductive barriers on exposed upper surfaces of the tungsten electrodes, forming an insulating layer comprising a plurality of openings such that the plurality of conductive barriers are exposed in the plurality of openings in the insulating layer, and forming a plurality of semiconductor devices on the conductive barriers in the plurality of openings.

Another embodiment provides a method of making a semiconductor device, comprising forming a plurality of lower electrodes over a substrate, forming an insulating layer containing a plurality of first openings having a first width, such that the lower electrodes are exposed in the first openings, forming first semiconductor regions of a first conductivity type in the first openings, forming a sacrificial material in the plurality of first openings over the first semiconductor regions, forming a plurality of second openings in the insulating layer to expose the sacrificial material, the second openings having a second width greater than the first width, removing the sacrificial material from the first openings through the second openings, forming second semiconductor regions of a second conductivity type in the first openings, wherein the first and the second semiconductor regions form pillar shaped diodes in the first openings, and forming upper electrodes in the second openings in the insulating layer such that the upper electrodes contact the second semiconductor regions.

BRIEF DESCRIPTION OF THE DRAWINGS

FIGS. 2A to 2C are side cross-sectional views illustrating stages in formation of a pillar device according to the second embodiment of the present invention.

FIGS. 3A to 3E are side cross-sectional views illustrating stages in formation of a pillar device according to the third embodiment of the present invention.

FIGS. 6A to 6G are side cross-sectional views illustrating stages in formation of a pillar device according to the fifth embodiment of the present invention.

DETAILED DESCRIPTION OF THE EMBODIMENTS

Figure 1A:
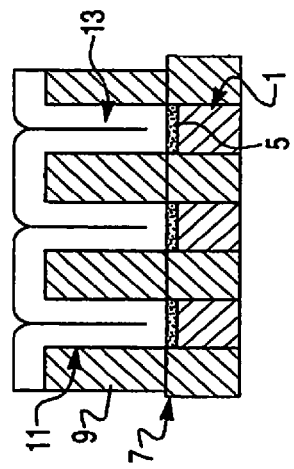
FIGS. 1A, 1C and 1E are side cross-sectional views illustrating stages in formation of a pillar device according to the first embodiment of the present invention.

The present inventors realized that for semiconductor pillar devices having at least two different conductivity type regions, such as a diode containing both p-type and n-type semiconductor regions, special steps have to be taken to avoid shorting such a device when the device is formed in an opening in an insulating layer.

For example, if the conductive barrier layer is simply deposited into the opening and then planarized, then the conductive barrier layer will extend along the sidewalls of the opening from the bottom to the top of the opening. If a semiconductor diode is then deposited into the opening, then the conductive barrier layer located along the sidewalls of the opening would short the p-type region of the diode to the n-type region of the diode.

Furthermore, if the semiconductor layers of the diode are formed by a method such as low pressure chemical vapor deposition (LPCVD), then the conformal deposition fills the opening from sides, not exclusively from the bottom. Thus, if the n-type semiconductor is deposited in the opening first, then it would either also be located along the entire sidewalls of the opening or it would fill the entire opening. If the n-type region is located along the sidewalls of the opening and the p-type region is located in the middle of the opening, then the upper electrode would contact both the p-type and the n-type regions. If the n-type region fills the entire opening, then there would be no place to form the p-type region in the opening to form the diode.

The embodiments of the present invention provide methods to overcome these problems. In the first embodiment, the barrier layer is selectively formed to avoid shorting the diode formed in the opening in the insulating layer above the barrier. In a first aspect of the first embodiment, the barrier layer may be formed by nitriding the underlying tungsten electrode to form a tungsten nitride barrier layer before or after forming the insulating layer. If the tungsten nitride barrier is formed after forming the insulating layer, then the barrier layer is formed by nitriding a portion of the tungsten electrode exposed in the opening in the insulating layer. This step of nitriding through the opening in the insulating layer is used to selectively form a tungsten nitride barrier layer on the bottom of the opening. In an alternative aspect of the first embodiment, the barrier layer is formed by nitridation on the electrode prior to formation of the insulating layer.

In the second embodiment, the barrier layer is formed by selective deposition on the underlying electrode. In the third embodiment, a selective silicon recess etch that can be precisely controlled is used to recess a silicon layer of one conductivity type in the opening prior to forming a silicon layer of the opposite conductivity type in the space in the opening created by the recess etch.

FIGS. 1 and 2 illustrate methods of making a nitrided barrier layer according to alternative aspects of the first embodiment. FIGS. 1A and 1B show a side cross sectional view and a three dimensional view, respectively, of a plurality of conductive electrodes 1 separated from each other by an insulating material or layer 3. The electrodes may have any suitable thickness, such as about 200 nm to about 400 nm. The electrodes 1 may comprise tungsten or another conductive material that can be nitrided. The insulating material may comprise any suitable insulating material, such as silicon oxide, silicon nitride, a high dielectric constant insulating material, such as aluminum oxide, tantalum pentoxide, or an organic insulating material. The electrodes may be formed by depositing a tungsten layer over any suitable substrate, photolithographically patterning the tungsten layer into electrodes 1, depositing an insulating layer over and between the electrodes 1, and planarizing the insulating layer by chemical mechanical polishing (CMP) or etchback to form the insulating material regions 3 which isolate the electrodes 1 from each other. Alternatively, the electrodes 1 may be formed by a damascene method, in which grooves are formed in the insulating layer 3, a tungsten layer is formed in the grooves and over the upper surface of the insulating layer 3, followed planarization of the tungsten layer by CMP or etchback to leave the electrodes 1 in the grooves in the insulating layer 3. The electrodes 1 may be rail shaped electrodes as shown in FIG. 1B. Other electrode 1 shapes may also be used.

Figure 1C:
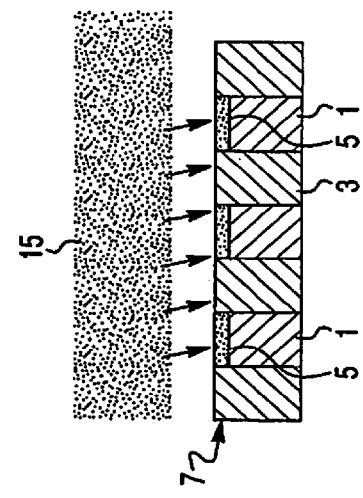
Figure 1E:
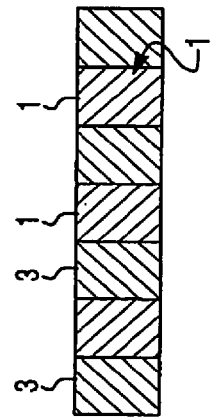
Figure 1B:
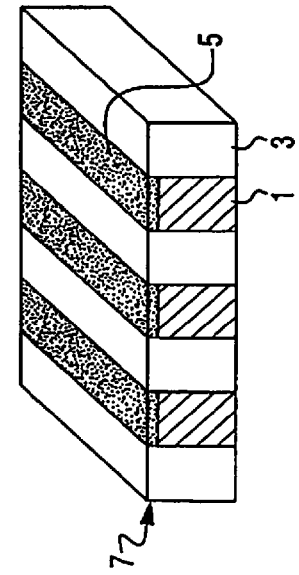
FIGS. 1B and 1D are three dimensional views of the stages shown in FIGS. 1A and 1C, respectively.
Figure 1D:
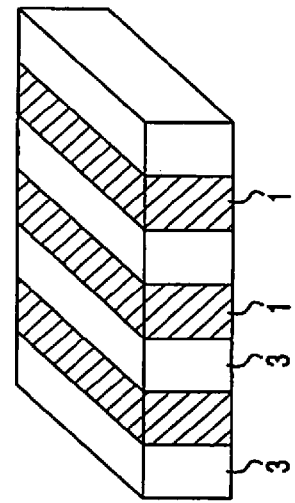

FIGS. 1C and 1D illustrate a step of nitriding the tungsten electrodes 1 to form tungsten nitride barriers 5 on the plurality of tungsten electrodes before the damascene type insulating layer is deposited on the electrodes 1. The barriers 5 may have any suitable thickness, such as about 1 nm to about 30 nm for example. Any nitriding method may be used. For example, a plasma nitriding method may be used in which a nitrogen containing plasma, such as an ammonia or nitrogen plasma, is provided to the surface of coexposed tungsten 1 and dielectric 3. The specifics of an exemplary plasma nitridation of tungsten to form tungsten nitride is described in U.S. Pat. No. 5,780,908, which is incorporated herein by reference in its entirety. It should be noted that the method in U.S. Pat. No. 5,780,908 is used to form a nitrided tungsten surface to provide a barrier between the tungsten and an aluminum layer above it, for the purpose of forming a metal gate, rather than for forming a barrier below a semiconductor device.

While tungsten was described as being used as the electrode 1 material, other materials, such as titanium, tungsten silicide or aluminum may also be used. For example, the stability of the tungsten nitride layer formed by nitridation of a tungsten silicide surface is discussed in U.S. Pat. No. 6,133,149 which is incorporated herein by referenced in its entirety.

The plasma nitridation nitrides the entire exposed surfaces of the electrodes 1 and insulating layer 3. This leaves a surface which is part tungsten nitride barriers 5 and part nitrogen containing insulating material 7 portions. For example, if the insulating material 3 was silicon oxide, then its upper portion is converted to silicon oxynitride 7 after the nitridation. Of course if the original insulating material 3 was silicon nitride, then the nitridation may form a nitrogen rich silicon nitride region 7 in the upper portion or surface of insulating material 3. Thus, the upper portions of the insulating layer or material 3 which separates adjacent tungsten electrodes 1 from each other is also nitrided during the nitriding step.

As shown in FIG. 1E, a second insulating layer 9 is deposited over the tungsten nitride barriers 5 and over the nitrided insulating material 7. The insulating layer 9 may have a better adhesion to the tungsten nitride surface than to an unnitrided tungsten surface. The insulating layer 9 may comprise any suitable insulating material, such as silicon oxide, silicon nitride, a high dielectric constant insulating material, such as aluminum oxide, tantalum pentoxide, or an organic insulating material. The material of layer 9 may be the same as or different from the material of insulating layer 3.

A plurality of openings 11 are formed in the insulating layer 9 such that the tungsten nitride barriers 5 are exposed in the plurality of openings 11. The openings 11 may be formed by photolithographic patterning, such as by forming a photoresist layer over the insulating layer 9, exposing and developing (i.e., patterning) the photoresist layer, etching the openings 11 in layer 9 using the photoresist pattern as a mask, and removing the photoresist pattern.

Thus, in the method of FIGS. 1A-1D, the step of nitriding to form the barriers 5 occurs before the step of forming the insulating layer 9. The insulating layer 9 is formed on the tungsten nitride barriers 5 followed by forming the plurality of openings 11 in the insulating layer 9 to expose upper surfaces of the tungsten nitride barriers 5.

A plurality of semiconductor devices are then formed on the tungsten nitride barriers 5 in the plurality of openings 11 in the insulating layer 9. For example, a silicon layer 13, such as a doped polysilicon or amorphous silicon layer is deposited on the barriers 5 in the openings 11. The formation of the semiconductor devices, such as pillar shaped diodes, will be described in more detail with respect to the third through fifth embodiments below.

FIGS. 2A-2C illustrate an alternative method of the first embodiment in which the insulating layer 9 is formed on the plurality of tungsten electrodes 1 (and on the insulating material or layer 3) before the formation of the barriers 5. A plurality of openings 11 are then formed in the insulating layer 9 to expose the upper surfaces of the plurality of tungsten electrodes 1 as shown in FIG. 2A. As shown in FIG. 2B, the step of nitriding occurs after the step of forming the plurality of openings 11 in the insulating layer 9 such that upper surfaces of the plurality of tungsten electrodes 1 are nitrided through the plurality of openings 11. For example, as shown in FIG. 2B, the nitrogen containing plasma 15 is provided into the openings 11 to nitride the tungsten electrodes 1. The nitridation forms the tungsten barriers 5 on the tungsten electrodes 1 in the openings 11.

Thus, the nitriding step is performed after forming the plurality of openings 11 in the insulating layer 9 to form the tungsten nitride barriers. Optionally, the nitriding step also nitrides at least one sidewall 12 of the plurality of openings 11 in the insulating layer 9. If the insulating layer 9 is silicon oxide, then the sidewalls 12 will be converted to a silicon oxynitride region 14. As used herein, the term "sidewalls" will refer to both one sidewall of an opening having a circular or oval cross section or to plural sidewalls of an opening having a polygonal cross section for convenience. Thus, the use of the term "sidewalls" should not be interpreted as being limited to sidewalls of an opening with a polygonal cross section. If the insulating layer 9 is a material other than silicon oxide, then it may also be nitrided. For example, metal oxides may also be converted to a metal oxynitride, silicon nitride may be converted to a nitrogen rich silicon nitride, while organic materials will contain a nitrogen rich region 14.

FIG. 2C shows the formation of the silicon layer 13 in the openings 11. Details of layer 13 deposition will be provided with respect to the third through fifth embodiments below.

The advantage of performing the nitridation after the planarization of the electrodes 1 as shown in FIGS. 1C and 1D is that the subsequent insulating layer 9 will not be deposited onto a tungsten surface. If the insulating layer is silicon oxide, then it may not provide an ideal adhesion to tungsten. However, silicon oxide adheres better to a metal nitride barrier, such as a tungsten nitride barrier 5.

If the plasma deposition reactor has the necessary gases plumbed, then the plasma nitridation can be performed in the same chamber as the insulating layer 9 deposition, without adding any process steps. In such a process, the nitriding plasma, such as a nitrogen or ammonia plasma, is turned on for a time to nitride the tungsten electrode 1 surfaces. Then, the nitrogen containing plasma is pumped from the deposition chamber and the insulating layer 9 deposition process begins by providing desired precursors, such as silicon and oxygen containing precursors (for example silane in combination with oxygen or nitrous oxide) to the deposition chamber to deposit layer 9. Preferably, layer 9 is silicon oxide deposited by PECVD.

The advantage of performing the nitridation after forming the openings 11 is that if the tungsten electrode sidewalls 2 are exposed in the opening 11 overetch, then the sidewalls 2 will also be nitrided, as shown in FIG. 2B. This can happen if the insulating layer 9 opening 11 overetch also removes the TiN adhesion layer which may be located below the tungsten electrodes 1. In other words, the plurality of openings 11 in the insulating layer 9 may be partially misaligned with the plurality of the tungsten electrodes 1 and the etching step using to form the plurality of openings 11 exposes at least portions of sidewalls 2 of the tungsten electrodes 1 due to the misalignment and over etching, as shown in FIG. 2A. Then, the step of nitriding forms tungsten nitride barriers 5 on the upper surfaces of electrodes 1 and tungsten nitride barriers 6 on exposed portions of the sidewalls 2 of the tungsten electrodes 1 as shown in FIG. 2B.

In case misalignment occurred during formation of the openings 11, the silicon layer 13 may extend into the overetched portions of the openings 11. However, silicon layer 13 contacts only the tungsten nitride barriers 5 and 6, but does not contact the tungsten electrodes 1 directly, as shown in FIG. 2C. When the final device, such as a pillar shaped diode, is completed, it is partially misaligned with the tungsten electrode 1 and the tungsten nitride barriers 5, 6 are located on an upper surface of the tungsten electrode and on at least a portion of a sidewall of the tungsten electrode. The oxide insulating layer 9 would be located around the diode, as will be described in more detail below, such that a portion 14 of the oxide insulating layer 9 located adjacent to at least one sidewall of the pillar shaped diode is nitrided.

Both non-limiting advantages of nitridation described above (improved insulating layer 9 adhesion to tungsten nitride and electrode 1 sidewall barrier 6 formation) will be achieved if the nitridation is performed before layer 9 deposition and after formation of the openings 11 in layer 9. Thus, if desired, the electrode 1 nitridation can be performed both after the bottom electrode planarization as shown in FIGS. 1C and 1D and after formation of the openings 11, as shown in FIG. 2B.

In the second embodiment, the conductive barriers 5 are formed by a selective deposition on exposed upper surfaces of the tungsten electrodes 1. For example, in one aspect of the second embodiment, metal or metal alloy barriers 5 are formed by selective atomic layer deposition on the plurality of tungsten electrodes. The barrier 5 metal or metal alloy may comprise tantalum, niobium or alloys thereof. Selective atomic layer deposition of a barrier metal, such as tantalum or niobium, is described in US published Patent Application No. 2004/0137721 which is incorporated herein by reference in its entirety. The atomic layer deposition of the barrier 5 is preferably conducted before the deposition of the insulating layer 9, as shown in FIGS. 1C and 1D. The selective deposition forms barriers 5 selectively only on the electrodes 1 but not the adjacent insulating layer or material 3. Thus, a metallic connection from the barriers 5 of the electrodes to the top surface of the insulating layer 9 is prevented.

In an alternative method of the second embodiment, the conductive barriers are formed by selective plating of a barrier metal or metal alloy on the plurality of tungsten electrodes. The plating may comprise electroless plating or electroplating which selectively plates the barriers 5 onto the electrodes 1 but not on the adjacent insulating layers 3 or 9. The barrier metals or metal alloys may comprise any conductive barrier materials that can be selectively plated onto the electrodes and not the insulating layers from a plating solution, such as cobalt and cobalt tungsten alloys, including CoWP. Selective deposition of a barrier metal alloy, such as CoWP by plating is described in "Thermal Oxidation of Ni and Co Alloys Formed by Electroless Plating", Jeff Gamindo and coauthors, MRS Abstract number F5.9, Apr. 17-21, 2006, San Francisco, incorporated herein by reference in its entirety. The selective plating may be conducted before the deposition of the insulating layer 9 and/or through the openings 11 in the insulating layer 9. In other words, the plating of the conductive barriers may be conducted before the step of forming the insulating layer 9, such that the insulating layer 9 is formed on the plurality of conductive barriers 5 followed by forming the plurality of openings 11 in the insulating layer 9 to expose upper surfaces of the plurality of conductive barriers 5. Alternatively, the plating of the conductive barriers may be conducted after the step of forming the plurality of openings 11 in the insulating layer 9 such that the plurality of conductive barriers are selectively formed on the upper surfaces of the plurality of tungsten electrodes 1 through the plurality of openings 11 in the insulating layer 9.

As described above with respect to FIGS. 2A to 2C, the openings 11 in the insulating layer 9 may be partially misaligned with the plurality of the tungsten electrodes 1, such that the step of forming the plurality of openings 11 exposes at least portions of sidewalls 2 of the tungsten electrodes 1. The selective deposition of the conductive barriers 5, such as the selective plating, forms the conductive barriers 5 on the upper surfaces and conductive barriers 6 on exposed portions of the sidewalls 2 of the plurality of tungsten electrodes 1.

A method according to the third embodiment forms pillar shaped devices, such as a pillar diodes, in the openings 11 in the insulating layer 9 by a modified process, as shown in FIGS. 3A-3E. The devices may be formed on the barrier layers 5, 6 of the first or second embodiments. Alternatively, the barrier layers 5, 6 may be omitted or the barriers 5 may be formed by non-selective layer deposition followed by photolithographic patterning rather than being formed by the methods of the first or the second embodiment.

As shown in FIG. 3A, the insulating layer 9 containing a plurality of openings 11 is provided over a substrate. The substrate can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate may include integrated circuits fabricated thereon, such as driver circuits for a memory device. As described above with respect to the first and the second embodiments, the lower electrodes, such as rail shaped tungsten electrodes 1 covered with barriers 5 are formed over the substrate as a first step in fabricating a nonvolatile memory array. Other conductive materials, such as aluminum, tantalum, titanium, copper, cobalt, or alloys thereof, may also be used. An adhesion layer, such as a TiN adhesion layer may be included below the electrodes 1 to help the electrodes to adhere to insulating layer 3 or other materials below the electrodes 1.

The insulating layer 9 can be any electrically insulating material, such as silicon oxide, silicon nitride, or silicon oxynitride, or an organic or inorganic high dielectric constant material. If desired, the insulating layer 9 may be deposited as two or more separate sublayers. Layer 9 may be deposited by PECVD or any other suitable deposition method. Layer 9 may have any suitable thickness, such as about 200 nm to about 500 nm for example.

The insulating layer 9 is then photolithographically patterned to form openings 11 extending to and exposing the upper surface of the barriers 5 of the electrodes 1. The openings 11 should have about the same pitch and about the same width as the electrodes 1 below, such that each subsequently formed semiconductor pillar is formed on top of a respective electrode 1. Some misalignment can be tolerated, as described above. Preferably, the openings 11 in the insulating layer 9 have a half pitch of 45 nm or less, such as 10 nm to 32 nm. The openings 11 with the small pitch may be formed by forming a positive photoresist over the insulating layer 9, exposing the photoresist to radiation, such as 193 nm radiation, while using an attenuated phase shift mask, patterning the exposed photoresist, and etching the openings 11 in the insulating layer 9 using the patterned photoresist as a mask. The photoresist pattern is then removed. Any other suitable lithography or patterning method may also be used. For example, other radiation wavelengths, such as the 248 nm wavelength, may be used with or without the phase shift mask. For example, 120-150 nm, such as about 130 nm wide openings may be formed with 248 nm lithography and 45-100 nm, such as about 80 nm wide openings may be formed with 193 nm lithography. Furthermore, various hardmasks and antireflective layers may also be used in the lithography, such as a BARC or DARC in combination with an insulating hardmask for 248 nm lithography, and BARC or DARC in combination with a dual W/insulating hardmask for 193 nm lithography.

A first semiconductor layer 13 is formed in the plurality of openings 11 in the insulating layer 9 and over the insulating layer 9. The semiconductor layer 13 may comprise silicon, germanium, silicon-germanium or a compound semiconductor material, such as a III-V or II-VI material. The semiconductor layer 13 may be an amorphous or polycrystalline material, such as polysilicon. The amorphous semiconductor material may be crystallized in a subsequent step. Layer 13 is preferably heavily doped with a first conductivity type dopant, such as p-type or n-type dopant, such as doped with a dopant concentration of $10^{18}$ to $10^{21}$ cm$^{-3}$. For illustration, it will be assumed that layer 13 is a conformally deposited n-type doped polysilicon. The polysilicon can be deposited and then doped, but is preferably doped in situ by flowing a dopant containing gas providing n-type dopant atoms, for example phosphorus or arsenic (i.e., in the form of phosphine or arsine gas added to the silane gas) during LPCVD deposition of the polysilicon layer. The resulting structure is shown in FIG. 3A.

As shown in FIG. 3B, an upper portion of the semiconductor layer 13, such as a polysilicon layer, is removed. The lower n-type portions 17 of the polysilicon layer 13 remain in lower portions of the openings 11 in the insulating layer 9, while upper portions 19 of the plurality of openings 11 in the insulating layer 9 remain unfilled. N-type portions 17 may be between about 5 nm and about 80 nm thick, such as about 10 nm to about 50 nm thick. Other suitable thicknesses may be used instead.

Any suitable method may be used to remove layer 13 from upper portions 19 of the openings 11. For example, a two step process may be used. First, the polysilicon layer 13 is planarized with an upper surface of the insulating layer 9. The planarization may be performed by CMP or etchback (such as isotropic etching) with optical end point detection. Once the polysilicon layer 13 is planarized with the upper surface of the insulating layer 9 (i.e., such that the polysilicon layer 13 fills the openings 11 but is not located over the top surface of the insulating layer 9), a second recess etching step may be performed to recess the layer 13 in the openings 11, such that only portions 17 of layer 13 remain in the openings 11. Any selective etching step, such as a wet or dry, isotropic or anisotropic etching step which selectively or preferentially etches polysilicon remaining in the upper portions of openings 11 over the insulating material of layer 9 (such as silicon oxide) may be used. Preferably, a dry etching step which provides a controllable etch end point is used.

Figure 3F:
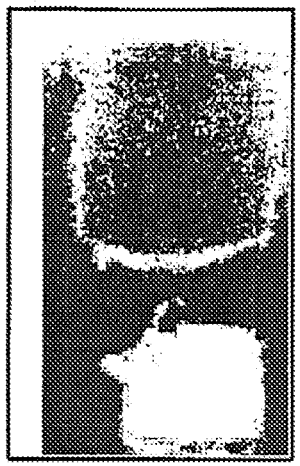
FIGS. 3F and 3G are micrographs of exemplary devices made according to the third embodiment.

For example, as shown in a micrograph in FIG. 3F, the recess etching step is a selective dry anisotropic etching step. In this step, the first semiconductor layer 13 remaining in the upper portions of the plurality of openings 11 is etched with a level etch front to recess the first semiconductor layer 13. The level etch front provides that portions 17 of the first semiconductor layer 13 remaining in the plurality of openings 11 have a substantially planar upper surface, as shown in FIG. 3F. This allows formation of a "parfait" shaped diode in which the boundary between different conductivity type regions is substantially planar.

Figure 3G:
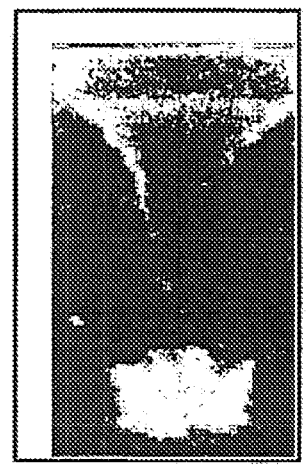

Alternatively, as shown in a micrograph in FIG. 3G, a selective isotropic etch may be used to recess layer 13. In this case, the portions of the first semiconductor layer 13 remaining in the plurality of openings 11 have an annular (i.e., hollow ring) shape with a groove in a middle, as shown in FIG. 3G.

As shown in FIG. 3C, a second semiconductor layer 21 is then formed in the upper portions 19 of the plurality of openings 11 in the insulating layer 9 and over the insulating layer 9. The second semiconductor layer 21 may comprise the same or different semiconductor material as the material of the first semiconductor layer 13. For example, layer 21 may also comprise polysilicon. It may be advantageous to deposit a layer 21 with a different semiconductor composition compared to the composition of layer 13, as described in U.S. Pat. No. 7,224,013 to Herner and Walker titled 'Junction diode comprising varying semiconductor compositions" and which is incorporated by reference herein in its entirety. For example, layer 13 may comprise silicon or silicon-germanium alloy having a relatively low percentage of germanium, while layer 21 may comprise germanium or a silicon-germanium alloy having a higher percentage germanium than layer 13 or vice-versa. If a p-n type diode is being formed in the openings 11, then layer 21 may be heavily doped with opposite conductivity type dopants, such as p-type dopants, from the conductivity type of layer 13. If desired, the second semiconductor layer 21 have the same conductivity type as the first layer 13, but a lower doping concentration than layer 13.

If a p-i-n type diode is being formed in the openings 11, then the second semiconductor layer 21 may be an intrinsic semiconductor material, such as intrinsic polysilicon. In this discussion, a region of semiconductor material which is not intentionally doped is described as an intrinsic region. It will be understood by those skilled in the art, however, that an intrinsic region may in fact include a low concentration of p-type or n-type dopants. Dopants may diffuse into the intrinsic region from adjacent regions, or may be present in the deposition chamber during deposition due to contamination from an earlier deposition. It will further be understood that deposited intrinsic semiconductor material (such as silicon) may include defects which cause it to behave as if slightly n-doped. Use of the term "intrinsic" to describe silicon, germanium, a silicon-germanium alloy, or some other semiconductor material is not meant to imply that this region contains no dopants whatsoever, nor that such a region is perfectly electrically neutral. The second semiconductor layer 21 is then planarized at least with an upper surface of the insulating layer 9 using chemical mechanical polishing to remove a first portion of the second semiconductor layer 21 located over the insulating layer 9 while leaving portions 23 of layer 21 in the upper portions 19 of openings 11. Alternatively, etchback may also be used. The intrinsic region or portions 23 may be between about 110 and about 330 nm, such as about 200 nm thick. The resulting device is shown in FIG. 3D.

Then, dopants of the opposite conductivity type to the conductivity type of regions 17 are implanted into upper sections of the second portions 23 of the second semiconductor layer 21 to form p-i-n pillar shaped diodes. For example, p-type dopants are implanted into the upper sections of intrinsic portions 23 to form p-type regions 25. The p-type dopant is preferably boron which is implanted as boron or $BF_2$ ions. Alternatively, region 25 may be selectively deposited on region 23 (after region 23 is recessed in openings 11) and then planarized rather than being implanted into region 23. For example, region 25 may be formed by depositing an in-situ p-type doped semiconductor layer by CVD followed by planarization of this layer. Region 25 may be about 10 nm to about 50 nm thick, for example. The pillar shaped p-i-n diodes 27 located in openings 11 comprise n-type regions 17, intrinsic regions 23 and p-type regions 25, as shown in FIG. 3E. In general, the pillar diodes 27 preferably have a substantially cylindrical shape with a circular or roughly circular cross section having a diameter of 250 nm or less. Alternatively, pillar diodes with polygonal cross sectional shapes, such as rectangular or square shapes may also be formed by forming openings 11 with polygonal cross sectional shapes instead of circular or oval cross sectional shapes.

Optionally, n+ dopant diffusion is prevented during subsequent intrinsic silicon deposition by the method described in U.S. Published Application 2006/0087005 titled "Deposited semiconductor structure to minimize N-type dopant diffusion and method of making" which is incorporated herein by reference in its entirety. In this method, the n-type semiconductor layer, such as an n-type polysilicon or amorphous silicon layer, is capped by a silicon-germanium capping layer having at least 10 atomic percent germanium. The capping layer may be about 10 to about 20 nm thick, preferably no more than about 50 nm thick, and contains little or no n-type dopant (i.e., the capping layer is preferably a thin, intrinsic silicon-germanium layer). The intrinsic layer of the diode, such as a silicon layer or silicon-germanium layer having less than 10 atomic percent germanium is deposited on the capping layer. Alternatively, an optional silicon rich oxide (SRO) layer is formed between the n-type region 17 and the intrinsic region 23 of each diode 27. The SRO region forms a barrier that prevents or decreases phosphorus diffusion from bottom n-type region 17 of the diode into the undoped region 23.

In the illustrative example, the bottom region 17 of the diode 27 is $N^+$ (heavily doped n-type), and the top region 25 is $P^+$. However, the vertical pillar can also comprise other structures. For example, bottom region 17 can be $P^+$ with $N^+$ top region 25. In addition, the middle region can intentionally be lightly doped, or it can be intrinsic, or not intentionally doped. An undoped region will never be perfectly electrically neutral, and will always have defects or contaminants that cause it to behave as if slightly n-doped or p-doped. Such a diode can be considered a p-i-n diode. Thus, a $P^+/N^-/N^+$, $P^+/P^-/N^+$, $N^+/N^-/P^+$ or $N^+/P^-/P^+$ diode can be formed.

Figure 4:
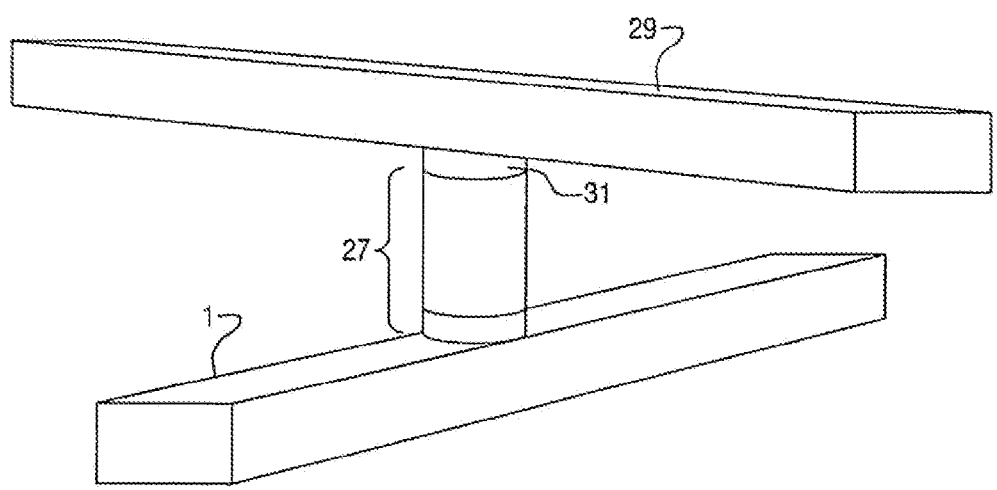
FIG. 4 is a three dimensional view of a completed pillar device according to one or more embodiments of the present invention.

Turning to FIG. 4, upper electrodes 29 can be formed in the same manner as the bottom electrodes 1, for example by depositing an adhesion layer, preferably of titanium nitride, and a conductive layer, preferably of tungsten. Conductive layer and adhesion layer are then patterned and etched using any suitable masking and etching technique to form substantially parallel, substantially coplanar conductor rails 29, extending perpendicular to conductor rails 1. In a preferred embodiment, a photoresist is deposited, patterned by photolithography, the conductive layers are etched, and then the photoresist is removed using standard process techniques. Alternatively, an optional insulating oxide, nitride, or oxynitride layer may be formed on heavily doped regions 25, and the conductors 29 are formed by a Damascene process, as described in Radigan et al., U.S. patent application Ser. No. 11/444,936, "Conductive Hard Mask to Protect Patterned Features During Trench Etch," filed May 31, 2006, hereby incorporated by reference in its entirety. Rails 29 may be about 200 nm to about 400 nm thick.

Next, another insulating layer (not shown for clarity) is deposited over and between conductor rails 29. The insulating material can be any known electrically insulating material, such as silicon oxide, silicon nitride, or silicon oxynitride. In a preferred embodiment, silicon oxide is used as this insulating material. This insulating layer can be planarized with the upper surface of the conductor rails 29 by CMP or etchback. A three dimensional view of the resulting device is shown in FIG. 4.

The pillar device, such as a diode device, may comprise a one-time programmable (OTP) or re-writable nonvolatile memory device. For example, each diode pillar 27 may act as a steering element of a memory cell and another material or layer 31 which acts as a resistivity switching material (i.e., which stores the data) is provided in series with the diode 27 between the electrodes 1 and 29, as shown in FIG. 4 Specifically, FIG. 4 shows one nonvolatile memory cell which comprises the pillar diode 27 in series with the resistivity switching material 31, such as an antifuse (i.e., antifuse dielectric), fuse, polysilicon memory effect material, metal oxide (such as nickel oxide, perovskite materials, etc,), carbon nanotubes, phase change materials, switchable complex metal oxides, conductive bridge elements, or switchable polymers. The resistivity switching material 31, such as a thin silicon oxide antifuse dielectric layer, may be deposited over the diode pillar 27 followed by the deposition of the upper electrode 29 on the antifuse dielectric layer. Antifuse dielectric 31 may also be formed by oxidizing an upper surface of the diode 27 to form a 1 to 10 nm thick silicon oxide layer. Alternatively, the resistivity switching material 31 may be located below the diode pillar 27, such as between the barrier 5 and another conductive layer, such as TiN layer. In this embodiment, a resistivity of the resistivity switching material 31 is increased or decreased in response to a forward and/or reverse bias provided between the electrodes 1 and 29.

In another embodiment, the pillar diode 27 itself may be used as the data storage device. In this embodiment, the resistivity of the pillar diode is varied by the application of a forward and/or reverse bias provided between the electrodes 1 and 29, as described in U.S. patent application Ser. No. 10/955,549 filed Sep. 29, 2004 (which corresponds to US Published Application 2005/0052915 A1) and U.S. patent application Ser. No. 11/693,845 filed Mar. 30, 2007 (which corresponds to US Published Application 2007/0164309 A1), both of which are incorporated by reference in their entirety. In this embodiment, the resistivity switching material 31 may be omitted if desired. While a nonvolatile memory device has been described, other devices, such as other volatile or nonvolatile memory devices, logic devices, display devices, lighting devices, detectors, etc., may also be formed by the methods described above. Furthermore, while the pillar shaped device was described as being a diode, other similar pillar shaped devices, such as transistors may also be formed.

Formation of a first memory level has been described. Additional memory levels can be formed above this first memory level to form a monolithic three dimensional memory array. In some embodiments, conductors can be shared between memory levels; i.e. top conductor 29 would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Figure 5A:
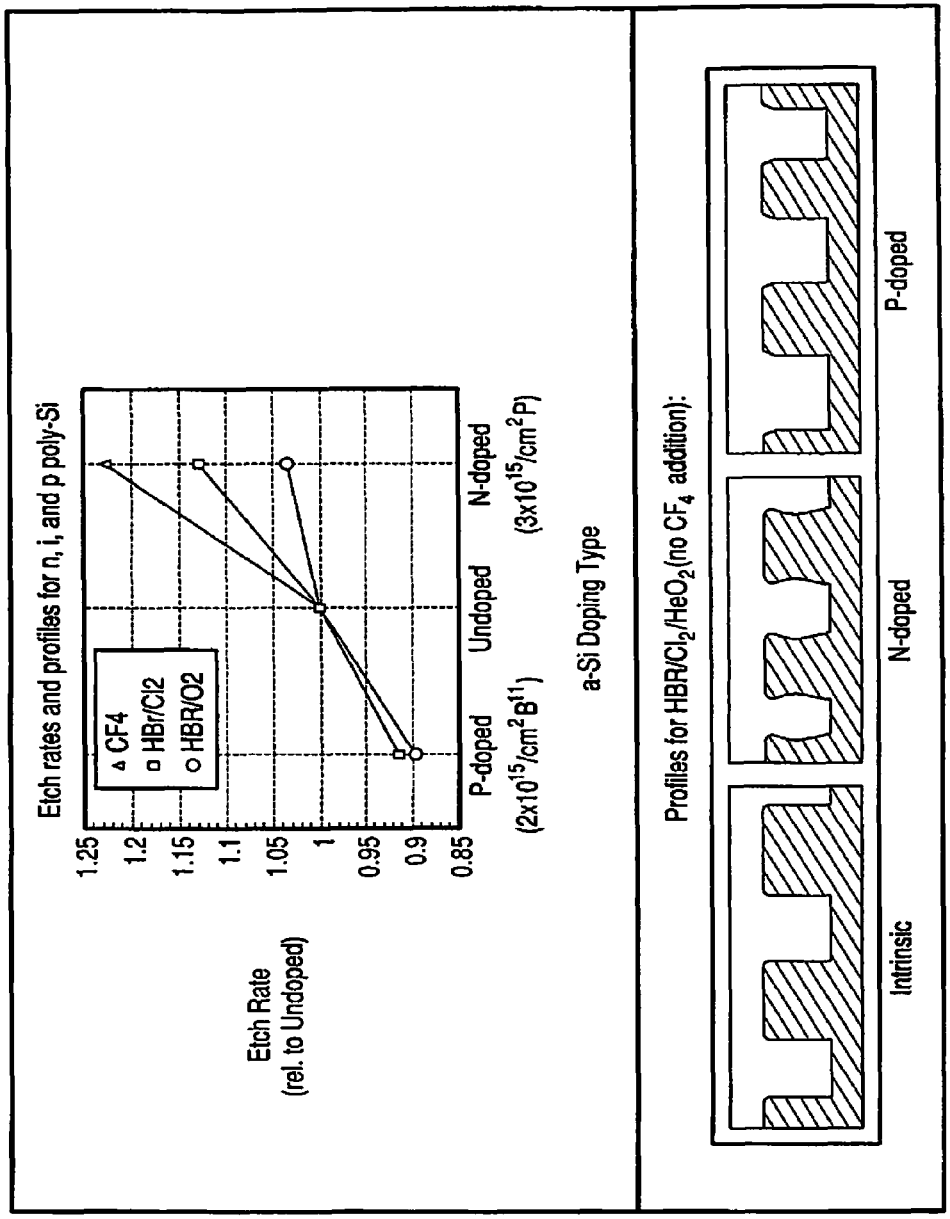
FIG. 5A is a prior art plot of etch rate versus polysilicon doping.

In a fourth embodiment of the invention, alternative etching and doping steps are used to form the pillar shaped device, such as a diode 27. In this embodiment, etch selectivity of various conductivity types of polysilicon is used in the recess etching step to provide end point detection. Specifically, phosphorus doped polysilicon has a faster etch rate than undoped silicon (see http://www.clarycon.com/Resources/Slide3t.jpg and http://www.clarvcon.com/Resources/Slide5i.jpg for data showing that differently doped polysilicon has different etch rates). The etching rates from the above mentioned website for phosphorus doped, boron doped and undoped polysilicon are shown in FIG. 5A.

The depth of the high-etch rate n-type doped layer can be tailored with the implant dose and energy. One optical etch endpoint detection method involves monitoring for a change in intensity of a wavelength that is characteristic to particular reactant or product in the etching reaction. When the etching endpoint is achieved, there will be a lower density of etch reaction products in the plasma, so the endpoint can be triggered, stopping the etch. Another etch endpoint detection uses a mass spectrometer to monitor for a particular species in the exhaust stream from the dry etching reaction, called RGA (residual gas analysis). The mass spectrometer can be located near or in the exhaust conduit of the etching reaction chamber. In this case, the RGA monitors for a phosphorus containing species in the exhaust stream, and provides an endpoint sign or trigger on a drop in the signal.

Figure 5B:
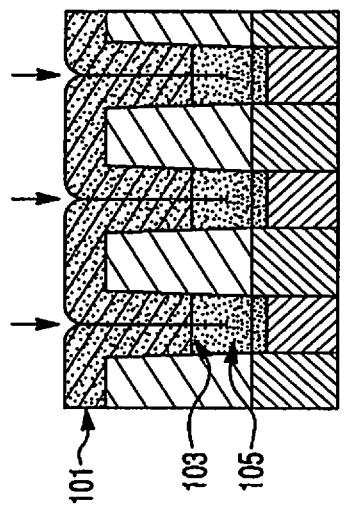
FIGS. 5B to 5E are side cross-sectional views illustrating stages in formation of a pillar device according to the fourth embodiment of the present invention.
Figure 5C:
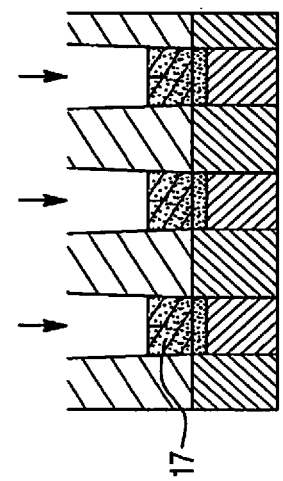

In the method of the fourth embodiment, the first polysilicon layer 13 is deposited undoped (i.e., intrinsic), as shown in FIG. 5B. Layer 13 is then implanted with phosphorus to a predetermined depth before or after layer 13 is planarized with the upper surface of the insulating layer 9 to form an implanted region 101, as shown in FIG. 5C. The depth of the implant is selected such that the bottom 103 of the phosphorus implanted region 101 will be located at or around the upper surface of region 17 that was shown in FIG. 3B. Intrinsic portions 105 of the first semiconductor layer 13 remain in lower portions of the plurality of openings 11.

Figure 5D:
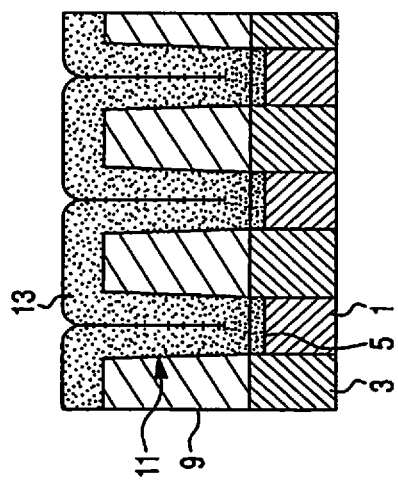
Figure 5E:
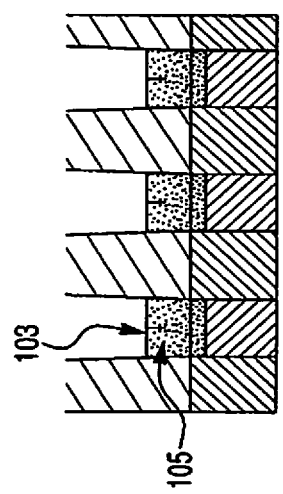

The first polysilicon layer 13 is then selectively etched, such as by using anisotropic plasma etching (using for example $SF_6$, $CF_4$, $HBr/Cl_2$ or $HBr/O_2$ plasma) to recess layer 13 in the openings 11. The phosphorus doped region 101 of the first polysilicon layer 13 is etched until the intrinsic portions 105 of the first polysilicon layer are reached, as shown in FIG. 5D. In other words, once the bottom 103 of the phosphorus implanted region 101 is reached during the etching step (and thus the intrinsic portions 105 of the first polysilicon layer 13 are reached during the etching step), as detected optically or by RGA, the etching is stopped. Specifically, when the bottom 103 of the phosphorus doped region 101 is reached, the intensity of the phosphorus characteristic wavelength will decrease in optical endpoint detection or the amount of phosphorus containing species detected by RGA will decrease. The remaining intrinsic portions 105 of layer 13 in openings 11 are then redoped with n-type dopant, such as by implanting phosphorus or arsenic into portions 105 to form n-type portions 17, as shown in FIG. 5E. The second semiconductor layer, such as the intrinsic semiconductor layer 21 is then deposited onto portions 17 as shown in FIG. 3C and the process continues as in the third embodiment. To form a diode 27 with a p-type bottom region, the portions 105 are implanted with boron or $BF_2$ after the recess etching. Furthermore, rather than using phosphorus implanted region for end point detection, boron or $BF_2$ implanted regions may be used, and a characteristic boron wavelength or RGA signature is monitored instead.

Furthermore, optical endpoint detection can be used to determine when layer 13 is planarized with the upper surface of the insulating layer 9. Once layer 13 is planarized, the upper surface of the insulating layer 9 is exposed. Thus, the optical signature of the surface will change from a polysilicon signature to a signature characteristic of presence of both polysilicon and insulator (such as silicon oxide).

In a fifth embodiment of the present invention, a sacrificial layer is used to form the pillar shaped devices. FIGS. 6A-6G illustrate the steps in the method of the fifth embodiment.

First, a plurality of lower electrodes 1 are formed over a substrate, as described above with respect to the prior embodiments. For example, tungsten electrodes 1 with barriers 5 of the first or the second embodiments may be provided (electrodes 1 and barriers 5 are omitted from FIG. 6A for clarity and are shown in the final device depicted in FIG. 6G). Then, the insulating layer 9 containing a plurality of openings 11 having a first width is provided over the electrodes 1 and barriers 5 (one opening 11 is shown in FIG. 6A for clarity). An optional hardmask layer 33 may also be formed over the insulating layer 9. Then, first semiconductor regions of a first conductivity type (such as n-type polysilicon regions) 17 are formed on the lower electrodes. For example, the methods of the third or fourth embodiments may be used to form regions 17. Then, a sacrificial material 35 is formed in the plurality of first openings 11. The sacrificial material may be any suitable soluble organic material which is used in dual damascene via first methods. For example, Wet Gap Fill (WGF) 200 material provided by Brewer Science, Inc. may be used as sacrificial material 35. The device at this stage in the process is shown in FIG. 6A.

Then, as shown in FIG. 6B, an optional antireflective layer 37, such as a BARC layer 37m is formed over the insulating layer 9 and over the optional hardmask 33. A photoresist layer 39 is then exposed and patterned over the BARC layer 37. The device at this stage in the process is shown in FIG. 6B.

As shown in FIG. 6C, the patterned photoresist is then used as a mask to etch a plurality of second openings 41 (one opening 41 is shown in FIG. 6C for clarity) in the insulating layer 9 to expose the sacrificial material 35 in openings 11. The second openings 41 are wider than the first openings 11. A portion of the sacrificial material 35 may be etched during the formation of the second openings. The second openings 41 comprise trench shaped openings in which the sacrificial material is exposed in a portion of the bottom of the trench.

As shown in FIG. 6D, the sacrificial material is selectively removed from the first openings 11 through the second openings 41. Any suitable liquid etching material or developer may be used to remove material 35 from openings 11 to expose n-type polysilicon regions 17 in the openings 11.

Then, as shown in FIG. 6E, second semiconductor regions of a second conductivity type are formed in the first openings 11. For example, the intrinsic polysilicon layer 21 may be formed in openings 11 and 41 and over the insulating layer 9.

The polysilicon layer 21 is then planarized and recessed using the methods described in the third embodiment. Preferably, the remaining portion 23 of polysilicon layer 21 is recessed such that its upper surface is level with the top of the openings 11 (i.e., the top of portion 23 is level with the bottom of trench 41). P-type regions 25 are then implanted into intrinsic regions 23 as described in the third embodiment above. The device at this stage is shown in FIG. 6F. Regions 17, 23 and 25 form pillar shaped diodes 27 in the first openings 11.

Then, as shown in FIG. 6G, upper electrodes are formed in the trenches 41 in the insulating layer 9 by a damascene process, such that the upper electrodes contact the p-type semiconductor regions 25 of the diodes 27. The upper electrodes may comprise a TiN adhesion layer 43 and tungsten conductors 29. The upper electrodes are then planarized by CMP or etchback with the upper surface of the insulating layer 9. If desired, a lower TiN adhesion layer 45 may also be formed below the lower electrodes 1. The trench may be about 200 nm to about 400 nm deep and the diode 27 may about 200 nm to about 400 nm high, such as about 250 nm high.

The pillar shaped devices may be made using any one or more steps described above with respect to any one or more of the first through fifth embodiments. Dependent on the process steps used, the completed device may have one or more of the following features shown in FIGS. 7A and 7B.

Figure 7A:
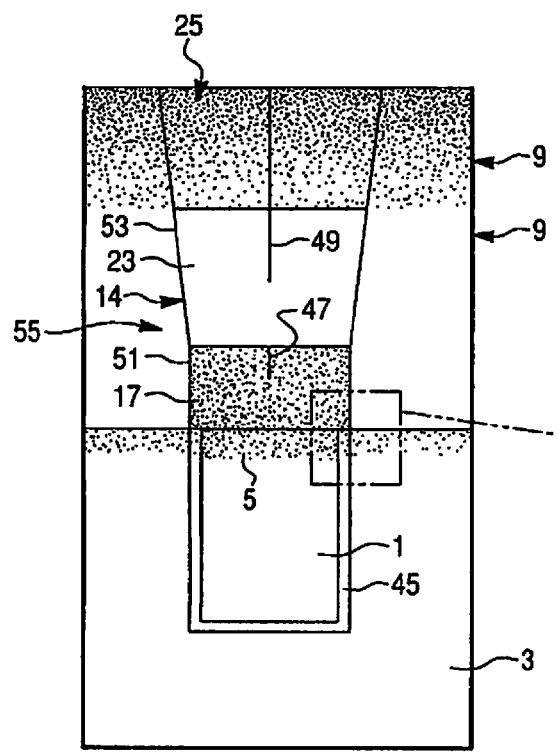
FIGS. 7A and 7B are side cross-sectional views of device features made according to the embodiments of the present invention.

For example, as shown in FIG. 7A, the n-type region 17 of the diode 27 may contain a first vertical seam 47, while the p-type region 25 (as well as the intrinsic region 23) of the diode 27 may contain a second vertical seam 49. The seams 47, 49 may be formed if the deposition of the polysilicon layers 13 and 21 does not completely fill the openings 11 during the separate deposition steps. The first 47 and the second 49 vertical seams do not contact each other. The seams do not contact each other because the polysilicon layers 13 and 21 are deposited in separate steps as shown in FIGS. 3A-3E. Specifically, without wishing to be bound by a particular theory, it is believed that the bottom portion of layer 21 which contacts region 17 would not form the seam since the bottom portion of layer 21 may fill the opening 11 completely. However, depending on the deposition process of the polysilicon layers 13 and 21 the seams may be omitted.

Furthermore, as also shown in FIG. 7A, the sidewalls 51 of the first conductivity type region (such as the n-type region 17) may have a different taper angle than sidewalls 53 of the second conductivity type region (such as the p-type region 25 and/or intrinsic region 23) of the diode. A discontinuity 55 is located in a sidewall of the diode 27 where the differently tapered sidewalls 51, 53 meet. Specifically, the first conductivity type region 17 has a narrower taper angle than the second conductivity type region 25 and the discontinuity 55 is a step in the sidewall of the diode between the intrinsic semiconductor region 23 and the n-type conductivity type region 17. Without wishing to be bound by a particular theory, it is believed that the different tapers and the discontinuity may be formed because the recess etchback of layer 13 shown in FIG. 3B is more isotropic than the step of etching the openings 11 in the insulating layer 9 shown in FIG. 3A. Thus, during the etchback of layer 13, the upper portions 19 of openings 11 are also etched and are widened compared to lower portions of openings 11. Thus, layers 13 and 21 which fill the lower and upper portions of openings 11, respectively, assume the different tapers of the respective portions of the openings. The different tapers and the discontinuity may be avoided if the recess etching step of layer 13 is conducted without widening the upper portions 19 of the openings.

If the barriers 5 are formed by nitriding the electrodes 1 through the openings 11 in the insulating layer 9, as shown in FIG. 2B, then the portion of the insulating layer 9 located adjacent to at least one sidewall of the pillar shaped diode 27 is nitrided. For example, as shown in FIGS. 2B and 7A, if layer 9 is silicon oxide, then a nitrided oxide, such as silicon oxynitride or nitrogen containing silicon oxide region 14 is formed on the sidewalls 12 of the openings 11 around the diode 27. Furthermore, if the upper portion of the insulating layer 9 adjacent to the p-type region 25 of the diode contains a boron gradient, then it indicates that boron was implanted into the insulating layer 9 in addition to being implanted into upper portions of regions 23 to form regions 25, as shown in FIGS. 3E and 7A.

Figure 7B:
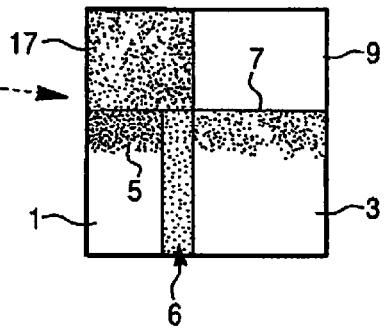

FIG. 7B shows an inset portion in FIG. 7A around the barriers 5, 6. If the pillar shaped diode is partially misaligned with the tungsten electrode, as shown in FIGS. 2A, 2B and 7B, then the tungsten nitride barrier 5 is located on an upper surface of the tungsten electrode 1 and the tungsten nitride barrier 6 is located on at least a portion of a sidewall of the tungsten electrode 1, as shown in FIG. 7B. Furthermore, if the barrier 5 is formed by nitriding the tungsten electrodes 1 before forming the insulating layer 9, as shown in FIGS. 1C and 1D, then a thin nitrogen rich region, such as a 1-10 nm thick nitrogen rich region 7 is formed on top of the lower insulating layer or material 3. For example, if layer 3 comprises an oxide, such as silicon oxide, then its top portion 7 is nitrided to form silicon oxynitride or nitrogen containing silicon oxide.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

The invention claimed is:

1. A method of making a semiconductor device, comprising:
    providing a substrate including a plurality of first conductive electrodes comprising a conductive material and separated from each other by an insulating material layer;
    forming an insulating layer containing a plurality of openings, wherein the insulating layer is located over the substrate, and top surfaces of the first plurality of first conductive electrodes are physically exposed underneath the plurality of openings;
    selectively forming a plurality of conductive barriers on exposed surfaces of the plurality of first conductive electrodes prior to formation of the insulating layer or after formation of the plurality of openings;
    depositing a first semiconductor layer in the plurality of openings in the insulating layer and directly on the insulating layer and directly on physically exposed surfaces of the plurality of conductive barriers;
    removing a first portion of the first semiconductor layer, wherein:
        first conductivity type second portions of the first semiconductor layer remain in lower portions of the plurality of openings in the insulating layer; and
        upper portions of the plurality of openings in the insulating layer remain unfilled;
    depositing a second semiconductor layer in the upper portions of the plurality of openings in the insulating layer and over the insulating layer; and
    removing a first portion of the second semiconductor layer located over the insulating layer;
    wherein second conductivity type second portions of the second semiconductor layer remain in upper portions of the plurality of openings in the insulating layer to form a plurality of pillar shaped diodes comprising the second conductivity type second portions of the second semiconductor layer and the first conductivity type second portions of the first semiconductor layer which remain in the plurality of openings.

2. The method of claim 1, wherein the first and the second semiconductor layers comprise polycrystalline silicon, germanium or silicon-germanium or amorphous silicon, germanium or silicon-germanium which is crystallized in a subsequent step.

3. The method of claim 2, wherein:
    the first and the second semiconductor layers comprise polysilicon layers; the first semiconductor layer comprises an in-situ n-type doped polysilicon layer; the openings in the insulating layer have a half pitch of 45 nm or less; and the openings are formed by forming a positive photoresist over the insulating layer, exposing the photoresist to radiation while using an attenuated phase shift mask, patterning the exposed photoresist, and etching the openings in the insulating layer using the patterned photoresist as a mask.

4. The method of claim 3, wherein the radiation comprises radiation having a wavelength of 193 nm.

5. The method of claim 1, wherein the step of removing at first portion of the first semiconductor layer comprises planarizing the first semiconductor layer with an upper surface of the insulating layer followed by selectively etching the first semiconductor layer remaining in the upper portions of the plurality of openings in the insulating layer.

6. The method of claim 5, wherein:
    the step of depositing the first semiconductor layer comprises depositing an intrinsic semiconductor layer and implanting dopants of a first conductivity type to a predetermined depth into the first semiconductor layer before or after the step of planarizing the first semiconductor layer, such that intrinsic portions of the first semiconductor layer remain in lower portions of the plurality of openings; and the step of selectively etching the first semiconductor layer comprises etching doped portions of the first semiconductor layer until the intrinsic portions of the first semiconductor layer are reached.

7. The method of claim 6, further comprising:
detecting when the intrinsic portions of the first semiconductor layer are reached during the step of selective etching; and
doping the intrinsic portions of the first semiconductor layer with dopants of the first conductivity type after the step of selective etching.

8. The method of claim 1, wherein the step of depositing the second semiconductor layer comprises:
depositing the second semiconductor layer comprising an intrinsic semiconductor material in the upper portions of the plurality of openings and over the insulating layer;
planarizing the second semiconductor layer at least with an upper surface of the insulating layer using chemical mechanical polishing or etchback; and
implanting dopants of the second conductivity type into upper sections of the second portions of the second semiconductor layer to form p-i-n pillar shaped diodes.

9. The method of claim 8, further comprising forming a silicon rich oxide layer or a silicon-germanium capping layer between the n-type region and an intrinsic region of each diode.

10. The method of claim 1, wherein the step of removing at first portion of the first semiconductor layer comprises:
planarizing the first semiconductor layer with an upper surface of the insulating layer using chemical mechanical polishing or etchback with optical end point detection; and
after the step of planarizing, selectively anisotropically etching the first semiconductor layer remaining in the upper portions of the plurality of openings in the insulating layer with a level etch front to recess the first semiconductor layer in the plurality of openings in the insulating layer, such that the second portions of the first semiconductor layer remaining in the plurality of openings have a substantially planar upper surface.

11. The method of claim 1, wherein the step of removing at first portion of the first semiconductor layer comprises:
planarizing the first semiconductor layer with an upper surface of the insulating layer using chemical mechanical polishing or etchback with optical end point detection; and
after the step of planarizing, selectively isotropically etching the first semiconductor layer remaining in the upper portions of the plurality of openings in the insulating layer to recess the first semiconductor layer in the plurality of openings in the insulating layer, such that the second portions of the first semiconductor layer remaining in the plurality of openings have an annular shape with a groove in a middle.

12. The method of claim 1, wherein:
a n-type region of the diode contains a first vertical seam;
a p-type region of the diode contains a second vertical seam; and
first and the second vertical seams do not contact each other.

13. The method of claim 1, further comprising forming an antifuse dielectric above or below the diode.

14. The method of claim 1, wherein:
the plurality of first conductive electrodes comprise a plurality of tungsten electrodes below the insulating layer; and
selectively forming the plurality of conductive barriers on exposed surfaces of the plurality of first conductive electrodes comprises nitriding the tungsten electrodes to form tungsten nitride barriers exposed in the plurality of openings in the insulating layer.

15. The method of claim 1, wherein the step of depositing the first semiconductor layer comprises depositing the first semiconductor layer by CVD, and wherein the step of depositing the second semiconductor layer comprises depositing the second semiconductor layer by CVD over the first semiconductor layer.

16. The method of claim 1, further comprising forming a monolithic three dimensional memory array over the substrate, wherein the array comprises a first memory level formed at a first height above the substrate and a second memory level formed at a second height different from the first height.

17. The method of claim 16, wherein the substrate comprises a silicon substrate.

18. The method of claim 1, wherein the plurality of conductive barriers are formed by converting surface portions of the plurality of first conductive electrodes into material portions including a nitride of the conductive material.

19. The method of claim 18, wherein the surface portions of the plurality of first conductive electrodes are converted into the material portions prior to formation of the insulating layer.

20. The method of claim 19, wherein the insulating material layer comprises a material selected from silicon oxide and silicon nitride, and surface portions of the insulating material layer are converted into dielectric material portions comprising a material selected from silicon oxynitride and nitrogen rich silicon nitride concurrently with conversion of the surface portions of the plurality of first conductive electrodes into material portions.

21. The method of claim 18, wherein the surface portions of the plurality of first conductive electrodes are converted into the material portions after formation of the plurality of openings.

22. The method of claim 21, wherein the insulating material layer comprises a material selected from silicon oxide, silicon nitride, and a metal oxide, and surface portions of the insulating material layer are converted into dielectric material portions comprising a material selected from silicon oxynitride, nitrogen rich silicon nitride, and a metal oxynitride concurrently with conversion of the surface portions of the plurality of first conductive electrodes into material portions.

23. The method of claim 18, wherein:
the plurality of first conductive electrodes comprises a material selected from tungsten, titanium, aluminum, and tungsten silicide; and
the material portions comprise nitrided tungsten, titanium, aluminum, or tungsten silicide.

24. The method of claim 18, wherein the material portions including the nitride of the conductive material is formed only on surfaces of the plurality of first conductive electrodes, and are not formed within the insulating material layer or the insulating layer.

25. The method of claim 1, wherein the plurality of conductive barriers is deposited by a selective deposition process.

26. The method of claim 25, wherein the selective deposition process is a selective atomic layer deposition process.

27. The method of claim 26, wherein the plurality of first conductive electrodes comprises tungsten, and the plurality of conductive barriers comprises a material selected from tantalum, niobium, and alloys thereof.

28. The method of claim 25, wherein the plurality of conductive barriers is formed by selective plating of a barrier metal or a barrier metal alloy.

29. The method of claim 28, wherein the plurality of first conductive electrodes comprises tungsten, and the plurality of conductive barriers comprise a material selected from cobalt, a cobalt tungsten alloy, and CoWP.

30. The method of claim 1, wherein a sidewall surface of at least one of the plurality of first conductive electrodes is physically exposed underneath one of the plurality of openings, and the first semiconductor layer is deposited directly on the sidewall surface.

31. The method of claim 1, wherein:
each of the plurality of first conductive electrodes comprise a tungsten nitride barrier; and
the physically exposed top surfaces of the plurality of first conductive electrodes comprise top surfaces of the tungsten nitride barriers.

32. The method of claim 1, further comprising forming a plurality of second conductive electrodes over the plurality of pillar shaped diodes.

33. The method of claim 32, wherein a bottom surface of each of the plurality of second conductive electrodes contact a top surface of a respective pillar shaped diode.

34. The method of claim 32, wherein:
the plurality of first conductive electrodes constitutes a plurality of first conductor rails that extend along a first horizontal direction; and
the plurality of second conductive electrodes constitutes a plurality of second conductor rails that extend along a second horizontal direction that is substantially perpendicular to the first horizontal direction.

35. The method of claim 32, wherein each of the plurality of second conductive electrodes comprises:
an adhesion layer contacting one of the plurality of pillar shaped diodes; and
a conductive layer contacting the adhesion layer and spaced from the plurality of pillar shaped diodes by the adhesion layer.

* * * * *